United States Patent [19]

Janutka

[11] Patent Number: 4,500,801

[45] Date of Patent: Feb. 19, 1985

[54] SELF-POWERED NONREGENERATIVE FAST GATE TURN-OFF FET

[75] Inventor: William J. Janutka, West Allis, Wis.

[73] Assignee: Eaton Corporation, Cleveland, Ohio

[21] Appl. No.: 390,481

[22] Filed: Jun. 21, 1982

[51] Int. Cl.³ .................... H03K 17/04; H03K 17/687
[52] U.S. Cl. .................................... 307/570; 307/246; 307/572; 307/581
[58] Field of Search ............... 307/499, 501, 360, 246, 307/570–572, 577, 579, 581, 584, 270, 252 A, 252 C, 252 D, 300; 357/23 GP

[56] References Cited

U.S. PATENT DOCUMENTS 3,819,952  6/1974  Enomoto et al. .......... 357/23 GP X
4,266,149  5/1981  Yoshida .......................... 307/270 X
4,347,445  8/1982  Baker .............................. 307/270 X
4,423,341 12/1983  Shelly ................................. 307/570

Primary Examiner—Larry N. Anagnos
Assistant Examiner—David R. Hudspeth
Attorney, Agent, or Firm—Andrus, Sceales, Starke & Sawall

[57] ABSTRACT

A fast turn-off FET circuit is provided by a bipolar transistor in the gate circuit of the FET. The bipolar transistor is driven into conduction by residual charge in the gate to source capacitance of the FET upon turn-off of the latter due to removal of gate drive. Conduction of the bipolar transistor provides faster discharge therethrough of the FET gate, whereby to facilitate faster FET turn-off without reverse gating current and its attendant auxiliary power supply.

4 Claims, 2 Drawing Figures

SELF-POWERED NONREGENERATIVE FAST GATE TURN-OFF FET

TECHNICAL FIELD

The invention relates to field effect transistors (FETs), and more particularly to gating circuitry facilitating fast turn-off.

BACKGROUND AND SUMMARY

Field effect transistors are well known in the art, including various gating techniques. An enhancement mode FET conducts current between its drain and source in response to gate voltage. Because of the capacitance that exists between the gate, source and drain of the FET, any change in the gate voltage is achieved only through an attendant movement of charge to and from the FET gate region. The speed with which a FET can be turned ON and OFF is dependent upon the speed with which the charge can be stored in and removed from the gate capacitance. Some gating circuits are able to supply sufficient to charge the gate rapidly to attain fast turn-on, but must rely on a resistance connected between the gate and source of the FET to remove the gate charge for turn-off. In order to achieve fast turn-off a low value resistance must be used requiring that a high current be maintained through the gate resistance while the FET is ON, all as is known.

The present invention provides fast turn-off but without a high current required from the gate driving source.

The FET turn-off circuitry of the present invention is self-powered in that the gate to source capacitance of the FET is used to drive a nonregenerative switch into conduction to enable faster discharge therethrough of the FET gate, whereby to facilitate faster FET turn-off.

DETAILED DESCRIPTION

Figure 1:
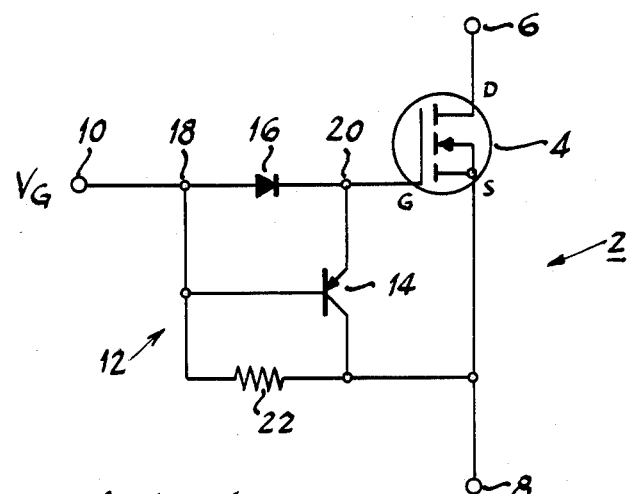
FIG. 1 is a circuit diagram of a fast turn-off FET constructed in accordance with the invention.
Figure 2:
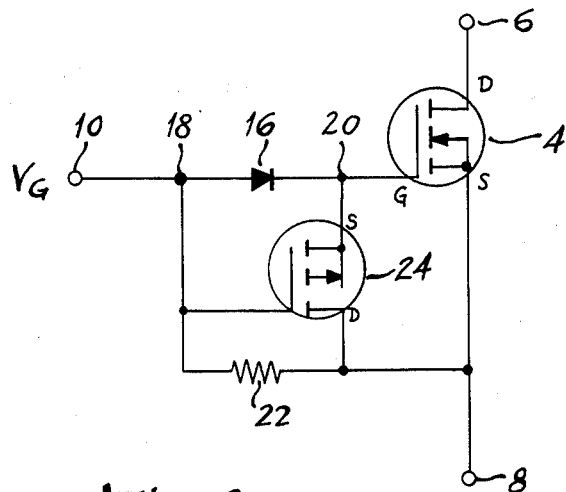
FIG. 2 is a circuit diagram of an alternate embodiment of FIG. 1.

The FET circuit 2 in FIG. 1 includes an n channel enhancement mode FET 4, such as a MOSFET, having a drain connected to drain terminal 6, a source connected to source terminal 8, and a gate connected to gate terminal 10. Upon application of gate drive to terminal 10, for example from a gating voltage source $V_G$, FET 4 is driven into its conductive ON state to conduct current between its drain and source in a given circuit application (not shown).

Nonregenerative switch means 12, for example transistor means, is connected to the FET gate and driven into conduction by residual stored charge in the gate to source capacitance of FET 4 upon turn-off of the latter due to removal of gate drive. A bipolar PNP transistor 14 is connected between the FET gate and the FET source at source terminal 8, and has its base connected to gate terminal 10. Transistor 14 is biased OFF in response to gate drive to FET 4, to prevent draining of the gate drive away from the FET gate. A diode 16 has its anode connected to gate terminal 10 and its cathode connected to the FET gate. The base of bipolar transistor 14 is connected to a point 18 between gate terminal 10 and diode 16. The emitter of transistor 14 is connected to a point 20 between diode 16 and the FET gate. The collector of transistor 14 is connected to source terminal 8. A resistor 22 is connected between the base and collector of transistor 14 to prevent diversion of gate drive from gate terminal 10 to the FET source.

Upon application of gate drive to terminal 10, diode 16 is forward biased and the emitter-base junction of transistor 14 is reverse biased. The voltage at the gate of FET 4 rises, turning FET 4 ON. When gate drive on terminal 10 is removed, diode 16 becomes reverse biased and the base-emitter junction of transistor 14 becomes forward biased, turning the latter ON.

The forward biasing of the base-emitter junction of transistor 14 is effected by the residual stored charge in the gate to source capacitance of FET 4 upon removal of gate drive. Resistor 22 provides a return path back to source terminal 8 for the forward current flow across the base-emitter junction of transistor 14. Since diode 16 is reverse biased at turn-off, it blocks current flow therethrough between the FET gate and the bipolar transistor base, and thus insures biasing of transistor 14 into conduction.

Conduction of transistor 14 provides faster discharge therethrough of the FET gate, whereby to facilitate faster FET turn-off. The result is a FET circuit 2 which requires only a small additional gating current for turn-on, due to added diode 16, but requires no reverse gating current for turn-off while still turning off rapidly. An alternative is to replace bipolar transistor 14 with a p channel MOSFET 24 having its source connected to the gate of FET 4, its drain connected to terminal 8 and its gate connected to the anode of diode 16. The threshold voltage of the p channel MOSFET must be lower than the threshold voltage of the n channel power FET 4.

It is recognized that various modifications are possible within the scope of the appended claims. One exemplary modification would be to employ a Darlington transistor arrangement for transistor 14.

I claim:

1. A fast turn-off FET circuit having drain, source and gate terminals, comprising;
   an enhancement mode FET having a drain connected to said drain terminal, a source connected to said source terminal, and a gate operatively coupled to said gate terminal;
   nonregenerative switch means comprising transistor means connected to said FET gate and source and driven into conduction by residual stored charge in the gate to source capacitance of said FET upon turn-off of the latter due to removal of gate drive, such that conduction of said switch means provides faster discharge therethrough of said FET gate, whereby to facilitate faster FET turn-off;
   gate biasing voltage source means for supplying gate drive to said gate terminal for carrying gate drive to said FET gate;
   wherein said transistor means comprises auxiliary FET means connected between said gate of said first mentioned FET and said source of said first mentioned FET, and biased OFF in response to gate drive to said first mentioned FET to prevent draining of said gate drive away from said first mentioned FET.

2. The invention according to claim 1 wherein said auxiliary FET means has one of its source and drain connected to said gate of said first mentioned FET, and the other of its source and drain connected to said source of said first mentioned FET, and has a gate connected to said gate terminal.

3. The invention according to claim 2 comprising a diode connected between said gate terminal and said first mentioned FET gate, said auxiliary FET means being connected to a node connecting said gate terminal and said diode, and said one of said source and drain of said auxiliary FET means being connected between said diode and said first mentioned FET gate, said diode being forward biased in response to gate drive to pass gate drive therethrough to drive said first mentioned FET gate, said diode being reverse biased in response to gate to source capacitance of said first mentioned FET upon removal of gate drive whereby to block current flow therethrough between said FET gate and said auxiliary FET means gate and insure biasing of said auxiliary FET means into conduction.

4. The invention according to claim 3 comprising resistor means connected between said gate of said auxiliary FET means and said other of said source and drain of said auxiliary FET means, of sufficient resistance to prevent significant diversion of gate drive from said gate terminal to said first mentioned FET source, and to provide a return path for biasing said auxiliary FET means into conduction.

* * * * *